United States Patent
Baroky et al.

(10) Patent No.: US 7,462,983 B2
(45) Date of Patent: Dec. 9, 2008

(54) WHITE LIGHT EMITTING DEVICE

(75) Inventors: Tajul Arosh Baroky, Penang (MY); Be Yin(Janet) Chua, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 29 days.

(21) Appl. No.: 10/609,190

(22) Filed: Jun. 27, 2003

(65) Prior Publication Data
US 2004/0263074 A1 Dec. 30, 2004

(51) Int. Cl.
*H01L 33/00* (2006.01)
*H01J 1/62* (2006.01)

(52) U.S. Cl. .................. 313/503; 313/512; 313/501; 313/502; 257/89; 257/98; 257/100

(58) Field of Classification Search ............... 313/503, 313/504, 483, 486, 512, 506; 257/98, 99, 257/100, 89
See application file for complete search history.

(56) References Cited

U.S. PATENT DOCUMENTS

| | | | | |
|---|---|---|---|---|
| 5,208,462 A * | 5/1993 | O'Connor et al. | ......... | 250/493.1 |
| 5,734,668 A * | 3/1998 | Raven et al. | ............. | 372/38.07 |
| 6,084,250 A * | 7/2000 | Justel et al. | .................... | 257/89 |
| 6,234,648 B1 | 5/2001 | Borner | | |
| 6,252,254 B1 * | 6/2001 | Soules et al. | .................... | 257/89 |
| 6,255,670 B1 * | 7/2001 | Srivastava et al. | ............. | 257/89 |
| 6,284,156 B1 | 9/2001 | Uehara et al. | | |
| 6,294,800 B1 * | 9/2001 | Duggal et al. | .................. | 257/89 |
| 6,340,824 B1 | 1/2002 | Komoto et al. | | |
| 6,391,504 B2 * | 5/2002 | Tai et al. | ........................ | 430/26 |
| 6,490,309 B1 * | 12/2002 | Okazaki et al. | ................ | 372/75 |
| 6,504,301 B1 * | 1/2003 | Lowery | ....................... | 313/512 |
| 6,576,488 B2 * | 6/2003 | Collins et al. | .................. | 438/29 |
| 6,586,882 B1 * | 7/2003 | Harbers | ....................... | 313/634 |
| 6,614,824 B2 * | 9/2003 | Tsuda et al. | .................... | 372/46 |
| 6,635,363 B1 * | 10/2003 | Duclos et al. | ................ | 428/690 |
| 6,653,765 B1 * | 11/2003 | Levinson et al. | ............. | 313/112 |
| 6,654,079 B2 * | 11/2003 | Bechtel et al. | ................. | 349/70 |
| 6,686,691 B1 * | 2/2004 | Mueller et al. | ............... | 313/503 |
| 6,720,584 B2 * | 4/2004 | Hata et al. | ..................... | 257/98 |
| 6,791,150 B2 * | 9/2004 | Takagi | ......................... | 257/432 |
| 6,825,056 B2 * | 11/2004 | Asakawa et al. | .............. | 438/47 |
| 2001/0008484 A1 | 7/2001 | Kato | | |

(Continued)

FOREIGN PATENT DOCUMENTS

WO WO 98/12757 A1 3/1998

(Continued)

OTHER PUBLICATIONS

'Full Color Fluorescent display Devices Using Near-UV Light-Emitting Diode', Yuichi Sato et al. Jpn. J. Appl. Phys. vol. 35 (1996) pp. L838-L839.*

(Continued)

*Primary Examiner*—Sikha Roy

(57) ABSTRACT

The invention provides light emitting devices having a phosphor layer that are useful as sources of white light, and other applications. The invention provides a light emitting device having a laser diode and a phosphor composition positioned to receive light from the laser diode. The laser diode is adapted to emit light, and the phosphor composition is adapted to absorb light from the laser diode and emit light at longer wavelengths than the light from the laser diode.

1 Claim, 2 Drawing Sheets

U.S. PATENT DOCUMENTS

| | | | |
|---|---|---|---|
| 2001/0043294 A1 | 11/2001 | Bechtel | |
| 2002/0074558 A1 | 6/2002 | Hata et al. | |
| 2002/0179886 A1* | 12/2002 | Kumar | 252/301.4 R |
| 2002/0187571 A1 | 12/2002 | Collins, III et al. | |
| 2003/0012244 A1* | 1/2003 | Krasulick et al. | 372/50 |
| 2003/0080341 A1 | 5/2003 | Sakano | |
| 2004/0056256 A1* | 3/2004 | Bokor et al. | 257/79 |
| 2004/0188697 A1* | 9/2004 | Brunner et al. | 257/99 |
| 2004/0212295 A1* | 10/2004 | Chua et al. | 313/503 |

FOREIGN PATENT DOCUMENTS

| | | |
|---|---|---|
| WO | WO 00/33390 A1 | 6/2000 |
| WO | WO 03/005458 A1 * | 1/2003 |

OTHER PUBLICATIONS

German Office Action dated Nov. 22, 2006 involving German counterpart application No. 10 2004 016 232.8-54.

English Translation of German Office Action dated Nov. 22, 2006 involving German counterpart application No. 10 2004 016 232.8-54.

* cited by examiner

WHITE LIGHT EMITTING DEVICE

FIELD OF THE INVENTION

The invention relates generally to light emitting devices and more particularly to light emitting diodes with a phosphor layer, which are useful as sources of white light, and other applications.

BACKGROUND OF THE INVENTION

Conventional white light sources include such devices as incandescent and fluorescent lamps. Such devices have several undesirable characteristics, including size, power consumption, limited operating life, among others. Alternative white light sources having improved characteristics are desired.

Semiconductor devices have been investigated as alternative sources of white light with a goal of finding white light sources that are both power efficient and cost efficient. Light emitting diodes (LEDs) are compact and emit light of clear color with high efficiency. Because they are solid-state elements, LEDs have long operating lifetimes, have good initial drive characteristics, exhibit good vibration resistance, and withstand repetitive ON/OFF operations. Thus, they have been widely used in such applications as various indicators and various light sources. In many applications, LEDs can provide suitable sources of light with low power consumption.

Conventional LEDs typically have a narrow emission spectrum (generate monochromatic light), and thus do not have a broad emission spectrum necessary to provide white light. Recently, devices using a combination of LEDs to provide three light components of red, green, and blue (R, G and B) have been used to provide white light. Large screen LED displays using these light emitting diodes have been put into use. Strategies for diffusing and mixing the light emitted by the LEDs become important in such devices to generate white light of the desired tone, luminance and other factors of the light emission of such devices. Also, combining three diodes (R, G and B) to provide white light requires a larger package than a single diode. Recently developed devices incorporate multiple light-generating active regions on a single semiconductor chip, where the multiple active regions each emit in a distinct wavelength region such that the combination of active regions cover the visible spectrum to emit white light.

Another typical approach for generating white light combines UV or blue light emitting diodes (LEDs) with luminescent materials (such as phosphors) that down-convert the LED emission to longer wavelength light. In such devices, the UV or blue light emission from an active region of a light emitting diode activates (excites) a phosphor composition that is positioned to receive the LED emitted light. In turn, the excited phosphor composition emits light at a longer wavelength. The net result is a light emitting device that emits light having a plurality of wavelengths over the visible spectrum. An appropriate combination of different wavelengths over the visible spectrum can be perceived as white light by the human eye. The composition of the phosphor is typically adjusted to change the color balance of the emitted light. In some cases, the phosphor composition contains more than one phosphor, wherein each phosphor emits at a different wavelength.

For example, U.S. Pat. Nos. 5,813,753 and 5,998,925 disclose light emitting devices in which a blue LED disposed in a reflective cup is surrounded by a phosphor composition. The blue LED emits blue light, a portion of which excites the phosphors in the phosphor composition. The phosphors are selected such that they emit red and green light upon excitation. The device will typically emit a combination of blue light (unabsorbed emission from the LED), and red light and green light (from the phosphors). The combination of wavelengths of light can be perceived by the human eye as white. The phosphor typically ages over the lifetime of the device, changing the efficiency with which the LED emission is converted to higher wavelength. Thus the output light characteristic of the device changes over the lifetime of the device, especially where multiple phosphors are used.

Thus, a white light emitting device is desired that is relatively small, light weight, has a long effective operating life, is power efficient, and is economical.

SUMMARY OF THE INVENTION

The invention addresses the aforementioned deficiencies in the art, and provides novel white light emitting devices having desirable power consumption characteristics.

The invention provides a light emitting device having a laser diode and a phosphor composition positioned to receive light from the laser diode. The laser diode is adapted to emit light, typically in the 340 nm to 490 nm range. The phosphor composition is adapted to absorb light from the laser diode and emit light having a longer wavelength than the light emitted from the laser diode. In a typical embodiment, the phosphor composition is adapted to emit light in the red and green portions of the visible spectrum. The red light is typically in the 590 nm to 650 nm range, and the green light is typically in the 520 nm to 550 nm range. In another embodiment, the phosphor composition is adapted to emit light in the yellow portion of the visible spectrum, such as in the 560 nm to 580 nm range.

The phosphor composition typically includes at least one type of phosphor particles, though certain embodiments may include two (or more) different types of phosphor particles, e.g. a first type of phosphor particles and a second type of phosphor particles. In some embodiments, the first type of phosphor particle emits red light upon excitation, and the second type of phosphor particle emits green light upon excitation. In certain embodiments, the phosphor composition includes a type of phosphor particles that emits yellow light upon excitation. In an embodiment, the phosphor composition includes three different types of phosphor particles, e.g a first type of phosphor particles that emits blue light upon excitation, a second type of phosphor particle that emits green light upon excitation, and a third type of phosphor particles that emits red light upon excitation. The phosphor composition typically further includes a binder material immobilizing the phosphor particles to a phosphor-bearing surface.

Additional objects, advantages, and novel features of this invention shall be set forth in part in the descriptions and examples that follow and in part will become apparent to those skilled in the art upon examination of the following specifications or may be learned by the practice of the invention. The objects and advantages of the invention may be realized and attained by means of the instruments, combinations, compositions and methods particularly pointed out in the appended claims.

BRIEF DESCRIPTION OF THE DRAWINGS

These and other features of the invention will be understood from the description of representative embodiments of the method herein and the disclosure of illustrative apparatus for carrying out the method, taken together with the Figures, wherein.

To facilitate understanding, identical reference numerals have been used, where practical, to designate corresponding elements that are common to the Figures. Figure components are not drawn to scale.

DETAILED DESCRIPTION

Figure 1:
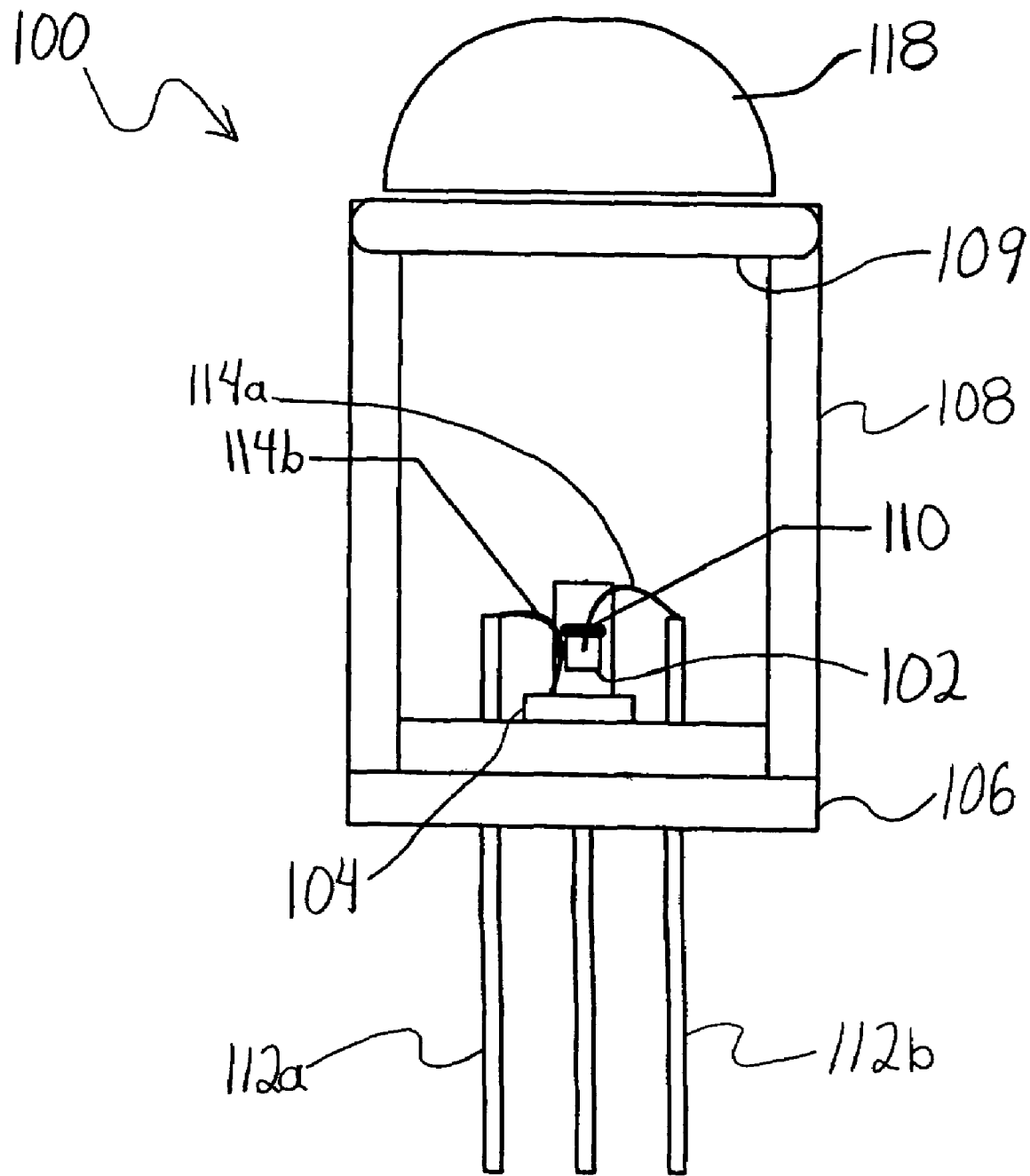
FIG. 1 illustrates an embodiment of the present invention.

Before the invention is described in detail, it is to be understood that unless otherwise indicated this invention is not limited to particular materials, reagents, reaction materials, manufacturing processes, or the like, as such may vary. It is also to be understood that the terminology used herein is for purposes of describing particular embodiments only, and is not intended to be limiting. It is also possible in the present invention that steps may be executed in different sequence where this is logically possible. However, the sequence described below is preferred.

It must be noted that, as used in the specification and the appended claims, the singular forms "a," "an" and "the" include plural referents unless the context clearly dictates otherwise. Thus, for example, reference to "a phosphor particle" includes a plurality of phosphor particles. In this specification and in the claims that follow, reference will be made to a number of terms that shall be defined to have the following meanings unless a contrary intention is apparent.

As used herein, "laser diode" refers to a device having a stack of semiconductor layers, including a double heterostructure and an active region which emits light when biased to produce an electrical current flow through the device, an optical resonator, and contacts attached to the stack. "LED" or "light emitting diode" refers to a device having stack of semiconductor layers (a "chip"), including an active region which emits light when biased to produce an electrical current flow through the device, and contacts attached to the stack, provided the LED has no double heterostructure and no optical resonator. A "blue laser diode" is a laser diode that emits blue light, e.g. in the wavelength range from about 440 nm to about 490 nm. A "violet laser diode" is a laser diode that emits violet light, e.g. in the wavelength range from about 400 nm to about 440 nm. A "UV laser diode" is a laser diode that emits ultraviolet light, e.g. in the wavelength range from about 200 nm to about 400 nm. In certain embodiments, the UV laser diode emits ultraviolet light in the wavelength range of about 340 to about 400 nm. With regard to light emitted from a laser diode or from a phosphor composition, unless a contrary range is explicitly stated, light that is described as being red has a wavelength in the range of 590 nm to about 650 nm, yellow light has a wavelength in the range of 560 nm to 580 nm, green light has a wavelength in the range of 520 nm to about 550 nm, blue light has a wavelength in the range of 440 nm to about 490 nm, violet light has a wavelength in the range of 400 nm to about 440 nm, and ultraviolet light has a wavelength in the range of 200 nm to about 400 nm (typically about 340 nm to about 400 nm); and embodiments of the present invention having laser diodes and phosphor compositions that emit light having wavelengths in one or more of the ranges specified in this sentence are specifically contemplated and included herein.

"Phosphor" refers to any luminescent materials which absorb light of one wavelength and emit light of a different wavelength. "Light emitting device" refers to a device that includes a laser diode and a phosphor composition, wherein the phosphor composition is adapted to receive light from the laser diode and emit light having a longer wavelength than the light emitted by the laser diode. "Excitation" refers to the process whereby the phosphor composition receives light. "White light emitting device" refers to a light emitting device that is capable of producing white light. "White light" refers to light that is perceived as white by a typical human observer; particular embodiments of white light include light that has a 'correlated color temperature' (CCT) in the range of about 3000 K to about 6500K and has a color rendering index ('CRI') of greater than about 85. In more typical embodiments, the CCT is in the range of about 4800 to about 6500K. In this regard, CCT is defined as the absolute temperature (expressed in degrees Kelvin) of a theoretical black body whose chromaticity most nearly resembles that of the light source. CRI is an indication of a light source's ability to show individual colors relative to a standard; the CRI value is derived from a comparison of the lamp's spectral distribution compared to a standard (typically a black body) at the same correlated color temperature. Both CCT and CRI are as known and used in the industry.

As used herein, when a light emission, e.g. from a phosphor composition or a laser diode, is said to occur at a given wavelength, or said to occur in a given wavelength range, it shall be interpreted as requiring that the emission is at least about 10% (typically at least about 20%) of the greatest relative intensity of emission that occurs at any wavelength in the range of 340 nm-700 nm. Thus, if a phosphor particle (or a phosphor composition) is said to emit light having a wavelength in the range of about 600 nm to about 625 nm, it is intended that the light emitted should be at least about 10% (typically at least about 20%) as intense at a wavelength in the range of about 600 nm to about 625 nm as compared to the intensity at the wavelength exhibiting the most intense emission (by the phosphor particle) over the wavelength range of 340 nm to 700 nm. As used herein, when a light emission from a specified element (e.g. from a phosphor composition or a laser diode) is said to have a peak emission wavelength at a given wavelength (or in a given range), it shall be interpreted as requiring that the emission intensity at the given wavelength (or at a wavelength within the given range) is at least about 30% (typically at least about 40%) of the greatest relative intensity of emission that occurs at any wavelength in the range of 340 nm-700 nm for the specified element under the same conditions.

EXAMPLES

The practice of the present invention will employ, unless otherwise indicated, conventional techniques of semiconductor manufacture, packaging, coating, materials synthesis, and the like, which are within the skill of the art. Such techniques are explained fully in the literature.

The following examples are put forth so as to provide those of ordinary skill in the art with a complete disclosure and description of how to perform the methods and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Standard temperature and pressure are defined as 20° C. and 1 atmosphere.

Now referring to the attached drawings, embodiments of the described invention will be described, below. With reference to FIG. 1, a light emitting device 100 according to the present invention is illustrated. The light emitting device 100 includes a laser diode 102 in the form of a semiconductor chip. The laser diode 102 is disposed on a submount heatsink 104, which is supported on a base 106 of a "metal can"-type package such as is typically used in the electronics components industry. The metal can-type package includes a casing wall 108 joined to the base 106 at one end of the casing wall 108 and joined to a transparent cap 109 at an opposite end of the casing wall 108. A surface of the laser diode 102 is coated with a phosphor composition 110. Contact terminals 112a, 112b proximate the laser diode 102 are in electrical communication with the contacts of the laser diode 102 via interconnect wires 114a, 114b. The contact terminals 112a, 112b extend through the base 106 to the exterior of the package to allow electrical potential applied at the contact terminals 112a, 112b to be communicated to the laser diode 102. A dome lens 118 is positioned adjacent the transparent cap 109 to direct light from the light emitting device 100. In this context, directing light from the light emitting device includes focusing and/or diffusing the light from the laser diode and/or the phosphor composition.

In use, a potential is applied across the contact terminals 112a, 112b to drive the laser diode 102. The laser diode 102 emits light in response to the applied potential. The light emitted from the laser diode passes through the phosphor composition 110, and phosphor particles in the phosphor composition absorb a portion of the light (the 'excitation light') emitted from the laser diode. The absorption of the excitation light by the phosphor particles results in down-conversion (conversion to longer wavelength) of the excitation light, thus producing light having a wavelength longer than the excitation light. The light emitting device thus emits light having a plurality of wavelength components, due to (a) light emitted from the laser diode that passes (unabsorbed) through the phosphor layer, and (b) light emitted from the phosphor composition resulting from down-conversion of phosphor-absorbed, laser diode-emitted light.

Figure 2:
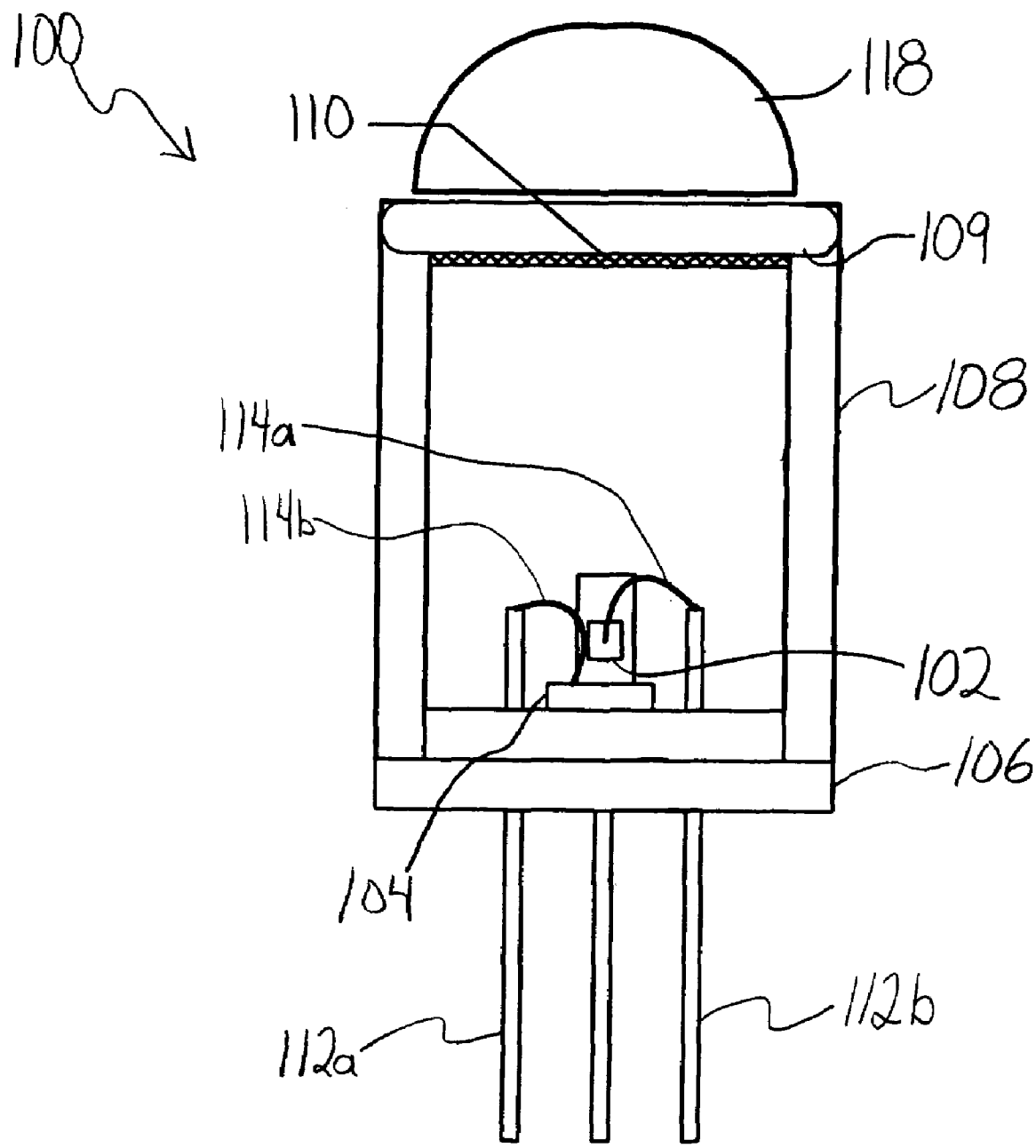
FIG. 2 depicts a further embodiment of the present invention.

Another embodiment of a device according to the present invention is illustrated in FIG. 2. A light emitting device 100 according to the present invention includes a laser diode 102 in the form of a semiconductor chip. The laser diode 102 is disposed on a submount heatsink 104, which is supported on a base 106 of a metal can-type package such as is typically used in the electronics components industry. The metal can-type package includes a casing wall 108 joined to the base 106 at one end of the casing wall 108 and joined to a transparent cap 109 at an opposite end of the casing wall 108. A surface of the transparent cap 109 is coated with a phosphor composition 110. Contact terminals 112a, 112b proximate the laser diode 102 are in electrical communication with the contacts of the laser diode 102 via interconnect wires 114a, 114b. The contact terminals 112a, 112b extend through the base 106 to the exterior of the package to allow electrical potential applied at the contact terminals 112a, 112b to be communicated to the laser diode 102. A dome lens I 18 is positioned adjacent the transparent cap 109 to direct light from the light emitting device 100.

The embodiment illustrated in FIG. 2 is used in much the same manner as that described for the embodiment shown in FIG. 1. In use, a potential is applied across the contact terminals 112a, 112b to drive the laser diode 102. The laser diode 102 emits light in response to the applied potential. The light emitted from the laser diode passes through the phosphor composition 110, and phosphor particles in the phosphor composition absorb a portion of the light (the excitation light) emitted from the laser diode. The absorption of the excitation light by the phosphor particles results in down-conversion of the light, thus producing light having a wavelength longer than the excitation light. The light emitting device thus emits light having a plurality of wavelength components, due to (a) light emitted from the laser diode that passes (unabsorbed) through the phosphor layer, and (b) light emitted from the phosphor composition resulting from down-conversion of phosphor-absorbed, laser diode-emitted light.

Any laser diode that outputs light in the desired wavelength range may potentially be used in a light emitting device according to the present invention. Examples of suitable laser diodes for use in a device according to the present invention include blue laser diodes, violet laser diodes, UV laser diodes. In certain embodiments the laser diode is a UV laser diode that emits light having a wavelength in the range from about 340 nm to about 400 nm, and in other embodiments the UV laser diode may emit light having a wavelength in the range from about 200 nm to about 400 nm. In another embodiment, the blue laser diode is a gallium nitride on silicon carbide substrate laser diode that emits light in the range of about 440 nm to about 490 nm. In yet another embodiment, the laser diode is a violet laser diode that emits light in the range of about 400 nm to about 440 nm. In some embodiments the violet laser diode emits light in the range of about 405 nm to about 430 nm. The exact wavelength range will be determined by selection from available sources, desired color attributes of the light emitting device (e.g. the 'correlated color temperature' of the emitted white light), choice of phosphor composition, and the like. Variation of such design parameters are within ordinary skill in the art given the disclosure herein.

In certain embodiments, the laser diode is operable in a pulsed mode. In some embodiments, the laser diode is operable in a continuous wave mode. The light emitting device may include drive circuitry for operating the laser diode in pulse mode and/or in continuous wave mode. The laser diode may be operable at a temperature below 0° C., e.g. in a temperature range from about minus 210° C. to about minus 80° C. Typically, the laser diode will be operable in the temperature range from about minus 20° C. to about 100° C., more typically in the temperature range of about 0° C. to about 80° C. In certain embodiments, the light emitting device further includes a temperature control device, such as a thermoelectric cooling element, such as is known in the art.

The laser diode typically is mounted to a base, optionally via a submount heatsink. The base may be any suitable material providing mechanical support for one or more of the laser diode, the heatsink, any optional submount, and/or the contact terminals. The laser diode may be mounted on a silicon carbide or other submount. In the embodiments illustrated, the laser diode is disposed in a metal can-type package; however, any package that performs the same functions of supporting elements of the light emitting device while allowing light to be directed from the light emitting device may be employed as a package. The laser diode has a semiconductor stack and contacts for applying a bias across the semiconductor stack. The contacts are typically wirebonded to contact terminals.

In the embodiment illustrated in FIG. 1, the laser diode has a surface that is coated with the phosphor composition. In the embodiment illustrated in FIG. 2, the phosphor composition is located on a surface of the transparent cap. In other embodiments, the phosphor composition is located at other positions, e.g. on a surface of the lens or on a surface of a separate structure intermediate the laser diode and the lens, provided the phosphor composition is positioned to receive light from the laser diode. The surface on which the phosphor composition is disposed is herein referred to as the phosphor-bearing surface. The phosphor composition may be deposited on the phosphor-bearing surface through any art-recognized techniques, including painting, spin coating, molding, encapsulation in a matrix, or any other suitable means. The thickness of the phosphor composition on the phosphor-bearing surface is typically in the range of about 15 micrometers to about 150 micrometers, more typically in the range of about 20 micrometers to about 120 micrometers, yet more typically in the range of about 25 micrometers to about 100 micrometers, although certain embodiments may be outside those ranges. The phosphor composition will typically be a conformal coating on the phosphor-bearing surface. The conformal coating is a coating having a uniform thickness, wherein the thickness does not vary by more than about 20%, typically not by more than about 10%. The phosphor composition may be deposited on the phosphor-bearing surface via an electrophoretic process, such as a process disclosed in U.S. patent application 2002/0187571, or in U.S. patent application Ser. No. 10/425,860, filed Apr. 28, 2003.

In an alternate embodiment, the phosphor composition comprises phosphor particles suspended in a clear polymer matrix, such as a resin, that is positioned intermediate the laser diode and the transparent cap. Optionally, the clear polymer matrix may partly surround the laser diode. Similarly, the lens and/or the transparent cap may be made of a clear polymer material in which phosphor particles are suspended. Such a lens and/or transparent cap made of the clear polymer material with phosphor particles suspended therein is positioned to receive light from the laser diode and to direct light from the light emitting device. Such embodiments will typically have more spatial variation in the output light, since the path length of the light through the polymer will typically vary. In various embodiments, the lens may have different configurations depending on the desired light output characteristics of the light emitting device, e.g. the lens may be a dome lens, a planar lens, or other suitable configuration.

The phosphor composition comprises at least one, typically at least two (or three, or four) types of phosphor particles, which each have their own emission characteristics. In an embodiment, the phosphor composition includes two different types of phosphor particles (a first type of phosphor particles and a second type of phosphor particles). In one embodiment, the laser diode is selected from a blue laser diode or a violet laser diode, the first type of phosphor particles is capable of emitting red light upon excitation by the light from the laser diode, and the second type of phosphor particles is capable of emitting green light upon excitation by the light from the laser diode. In such an embodiment, the light emitting device thus emits light having a plurality of wavelength components, due to (a) light emitted from the laser diode that passes (unabsorbed) through the phosphor layer, (b) red light resulting from down-conversion of phosphor-absorbed, laser diode-emitted light, and (c) green light resulting from down-conversion of phosphor-absorbed, laser diode-emitted light. The result is a light emitting device that emits white light.

In another embodiment, the phosphor composition comprises a type of phosphor particles that is capable of emitting yellow light, e.g. having a wavelength in the range of about 560 to about 580, upon excitation by blue or violet light, and the laser diode is selected from a blue laser diode or a violet laser diode. Such an embodiment of the light emitting device thus emits light having a plurality of wavelength components, due to (a) light emitted by the laser diode that passes (unabsorbed) through the phosphor layer, and (b) yellow light resulting from down-conversion of phosphor-absorbed, laser diode-emitted light. The result is a light emitting device that emits white light.

In an embodiment, the phosphor composition includes three different types of phosphor particles (a first type of phosphor particles, a second type of phosphor particles, and a third type of phosphor particles). In one embodiment, the laser diode is a UV laser diode, the first type of phosphor particles is capable of emitting red light upon excitation, the second type of phosphor particles is capable of emitting green light upon excitation, and the third type of phosphor particles is capable of emitting blue light upon excitation. In such an embodiment, the light emitting device thus emits light having a plurality of wavelength components, due to (a) UV light that passes (unabsorbed) through the phosphor layer, (b) red light resulting from down-conversion of phosphor-absorbed light, (c) green light resulting from down-conversion of phosphor-absorbed light, and (d) blue light resulting from down-conversion of phosphor-absorbed light. The result is a light emitting device that emits white light.

In an alternate embodiment of a white light emitting device, the device comprises a UV laser diode and a phosphor composition including two different types of phosphor particles (a first type of phosphor particles and a second type of phosphor particles). In one such embodiment, the first type of phosphor particles is capable of emitting yellow light upon excitation, and the second type of phosphor particles is capable of emitting blue light upon excitation. In such an embodiment, the light emitting device thus emits light having a plurality of wavelength components, due to (a) UV light that passes (unabsorbed) through the phosphor layer, (b) yellow light resulting from down-conversion of phosphor-absorbed light, and (c) blue light resulting from down-conversion of phosphor-absorbed light. The result is a light emitting device that emits white light.

The phosphor composition typically includes phosphor particles and a binder material immobilizing the phosphor particle to a phosphor-bearing surface. The appropriate binder will be selected with reference to the particular method used for coating the phosphor-bearing surface. Suitable binders have been described and are known in the art. The binder material may be an organic material such as an optical coupling epoxy (e.g., PT 1002 from Pacific Polymer Technology), an optical coupling silicone (e.g., silicone supplied by Nye Lubricants), inorganic metal oxide or glass frit powder (e.g., a PbO-based glass), or sol-gel. Binder material may be infused into the phosphor matrix by selective deposition and capillary action after the phosphor particles are deposited on the phosphor-bearing surface. Binder material may be co-deposited with the phosphor particles onto the phosphor-bearing surface during an electrophoretic deposition process. See also U.S. Pat. No. 6,180,029, WIPO Publ'n no. 00/33390 which describe binder materials, clear polymers, and phosphors for use in phosphor-conversion diodes.

The phosphor particles are characterized as being capable of down-conversion, that is, after being stimulated (excitation) by relatively shorter wavelength light, they produce longer wavelength light (emission). The phosphor composition comprises at least one, typically at least two (or three, or four) types of phosphor particles, which each have their own emission characteristics. In an embodiment having at least two different types of phosphor particles, the first type of phosphor particle emits red light upon excitation, and the second type of phosphor particle emits green light upon excitation. For red emission, typical phosphor particles suitable for use in the phosphor composition comprise a material selected from $SrS:Eu^{2+}$; $CaS:Eu^{2+}$; $CaS:Eu^{2+},Mn^{2+}$; $(Zn,Cd)S:Ag^{+}$; $Mg_4GeO_{5.5}F:Mn^{4+}$; $Y_2O_2S:Eu^{2+}$, $ZnS:Mn^{2+}$, and other phosphor materials having emission spectra in the red region of the visible spectrum upon excitation as described herein. For green emission, typical phosphor particles suitable for use in the phosphor composition comprise a material selected from $SrGa_2S_4:Eu^{2+}$; ZnS:Cu,Al and other phosphor materials having emission spectra in the green region of the visible spectrum upon excitation as described herein. In certain embodiment, blue emitting phosphor particles may be included in the phosphor composition in addition to the red- and green-emitting phosphors; suitable blue emitting phosphor particles may comprise, e.g. $BaMg_2Al_{16}O_{27}:Eu^{2+}$,Mg or other phosphor materials having emission spectra in the blue region of the visible spectrum upon excitation as described herein. In another embodiment, the phosphor composition comprises a type of phosphor particles that is selected to produce yellow light upon excitation. For yellow emission, typical phosphor particles suitable for use in the phosphor composition comprise a material selected from $(Y,Gd)_3Al_5O_{12}:Ce,Pr$ and other phosphor materials having emission spectra in the yellow region of the visible spectrum upon excitation as described herein.

The red-emitting phosphor particles typically have a peak emission wavelength in the range of about 590 nm to about 650 nm. In particular embodiments, the phosphor particles have a peak emission wavelength in the range of about 620 nm to about 650 nm, typically in the range of about 625 nm to about 645 nm, more typically in the range of about 630 nm to about 640 nm. In some embodiments, the phosphor particles have a peak emission wavelength in the range of about 590 nm to about 625 nm, typically in the range of about 600 nm to about 620 nm. In some embodiments, the phosphor particles emit light having a wavelength in the range of about 600 nm to about 650 nm, typically in the range of about 610 nm to about 640 nm, more typically in the range of about 610 nm to about 630 nm.

The green-emitting phosphor particles typically have a peak emission wavelength in the range of about 520 nm to about 550 nm. In particular embodiments, the phosphor particles have a peak emission wavelength in the range of about 530 nm to about 550 nm, typically in the range of about 535 nm to about 545 nm. In some embodiments, the phosphor particles have a peak emission wavelength in the range of about 520 nm to about 535 nm. In some embodiments, the phosphor particles emit light having a wavelength in the range of about 520 nm to about 550 nm, typically in the range of about 535 nm to about 550 nm, or in the range of about 520 nm to about 535 nm.

The blue-emitting phosphor particles typically have a peak emission wavelength in the range of about 440 nm to about 490 nm. In particular embodiments, the phosphor particles have a peak emission wavelength in the range of about 450 nm to about 470 nm, typically in the range of about 455 nm to about 465 nm. In some embodiments, the phosphor particles have a peak emission wavelength in the range of about 440 nm to about 450 nm, typically in the range of about 435 nm to about 445 nm. In some embodiments, the phosphor particles emit light having a wavelength in the range of about 440 nm to about 480 nm, typically in the range of about 450 nm to about 470 nm.

The yellow-emitting phosphor particles typically have a peak emission wavelength in the range of about 560 nm to about 580 nm. In particular embodiments, the phosphor particles have a peak emission wavelength in the range of about 565 nm to about 575 nm. In some embodiments, the phosphor particles have a peak emission wavelength in the range of about 575 nm to about 585 nm. In an embodiment, the phosphor particles emit light having a wavelength in the range of about 560 nm to about 580 nm, typically in the range of about 565 nm to about 575 nm.

The exact wavelength range for each of the above described type of phosphor particles will be determined by selection from available sources of phosphors, desired color attributes of the light emitting device (e.g. the 'correlated color temperature' of the emitted white light), choice of LED, and the like. Variation of such design parameters are within ordinary skill in the art given the disclosure herein. Useful phosphor materials and other information may be found in Mueller-Mach et al., "High Power Phosphor-Converted Light Emitting Diodes Based on III-Nitrides", IEEE J. Sel. Top. Quant. Elec. 8(2):339 (2002).

The phosphor particles typically may be obtained in a range of particle sizes. In some embodiments, the mean particle diameter of the phosphor particles is in the range of 2-5 micrometers. Larger phosphor particles tend to emit light more efficiently; however, obtaining uniform coatings of phosphor particles becomes more difficult as size increases. Electrophoretic deposition methods have been used successfully with larger phosphor particles, e.g. having mean particle diameter in the range of about 13 micrometers to about 20 micrometers, and a $d_{90}$ in the range of about 30 micrometers to about 45 micrometers, where $d_{90}$ refers to the size at which 90 volume percent of the particles are smaller than the indicated size.

Phosphor particles for certain embodiments may be obtained from Phosphor Technology, Ltd. (Essex, England). A suitable phosphor material obtained from this source is Strontium Sulphide: Europium ($SrS:Eu^{2+}$) (Part no. name: HL63/S-D1). This phosphor material has a particle size distribution (as measured by a Coulter Counter with 50 micron aperture) as shown below:

| Ultrasonic Dispersion. Size at listed Volume % | | | | | |
|---|---|---|---|---|---|
| | vol % | | | | |
| | 5 | 25 | 50 | 75 | 95 |
| micron | 2.3 | 3.5 | 5.0 | 7.2 | 11.9 |

Quartile Deviation: 0.35

This red-emitting phosphor material has an emission wavelength peak at about 615 nm and an excitation wavelength peak in the range of about 460-490 nm.

Another suitable phosphor material obtained from Phosphor Technology, Ltd. is Strontium Thiogallate: Europium ($SrGa_2S_4:Eu^{2+}$). This phosphor material has a particle size distribution (as measured by Coulter Counter with a 50 micron aperture) as shown below:

| Ultrasonic Dispersion. Size at listed Volume % | | | | | |
|---|---|---|---|---|---|
| | vol % | | | | |
| | 5 | 25 | 50 | 75 | 95 |
| micron | 1.7 | 3.1 | 5.0 | 7.5 | 14.7 |

Quartile Deviation: 0.32

This green-emitting phosphor material has an emission wavelength peak at about 535 nm and an excitation wavelength peak in the range of about 440-470 nm.

Another suitable phosphor obtained from Phosphor Technology, Ltd. is (Yttrium, Gadolinium) Aluminate Phosphor ($(Y,Gd)_3Al_5O_{12}:Ce,Pr$). This phosphor material has a particle size distribution (as measured by Coulter Counter with 50 micron aperture) as shown below:

| Ultrasonic Dispersion. Size at listed Volume % | | | | | |
|---|---|---|---|---|---|
| | vol % | | | | |
| | 5 | 25 | 50 | 75 | 95 |
| micron | 1.7 | 2.9 | 4.0 | 5.6 | 9.4 |

Quartile Deviation: 0.32

This yellow-emitting phosphor material has an emission wavelength peak at about 570 nm and an excitation wavelength peak at about 470 nm.

Other suitable phosphors for use in devices according to the present invention may be obtained from this and other commercial sources. The preparation of phosphors is described in the literature and suitable phosphors may be prepared accordingly by one of ordinary skill given the disclosure herein.

While the foregoing embodiments of the invention have been set forth in considerable detail for the purpose of making a complete disclosure of the invention, it will be apparent to those of skill in the art that numerous changes may be made in such details without departing from the spirit and the principles of the invention. Accordingly, the invention should be limited only by the following claims.

All patents, patent applications, and publications mentioned herein are hereby incorporated by reference in their entireties.

What is claimed is:

1. A light emitting device comprising:
   a laser diode; and
   a phosphor composition positioned to receive light from said laser diode, the phosphor composition capable of absorbing light from said laser diode and emitting light at a wavelength longer than the light from the laser diode, wherein the phosphor composition consists of a first type of phosphor particles consisting of $ZnS:Mn^{2+}$, and a second type of phosphor particles,
   wherein the first type of phosphor particles emits red light upon excitation, and the second type of phosphor particle emits green light upon excitation.

* * * * *